United States Patent [19]
Stratton et al.

[11] Patent Number: 5,177,555
[45] Date of Patent: Jan. 5, 1993

[54] METHOD AND APPARATUS FOR TESTING ELECTRICAL CONNECTORS

[75] Inventors: Mark D. Stratton, North Andover; Terri G. Laird, Salem, both of Mass.

[73] Assignee: Digital Equipment Corporation, Maynard, Mass.

[21] Appl. No.: 676,794

[22] Filed: Mar. 28, 1991

[51] Int. Cl.$^5$ .............................................. G01L 1/24
[52] U.S. Cl. .................................. 356/35.5; 356/345; 356/351; 356/33; 250/227.19
[58] Field of Search ............... 356/355, 35.5, 33, 345, 356/351; 250/227.19, 227.27; 73/705, 657, 800

[56] References Cited

U.S. PATENT DOCUMENTS

| | | | |
|---|---|---|---|
| 3,950,987 | 4/1976 | Slezinger et al. | 356/33 |
| 4,368,645 | 1/1983 | Glenn et al. | 73/705 |
| 4,442,350 | 4/1984 | Rashleigh | 73/657 |
| 4,740,078 | 4/1988 | Daendliker et al. | 356/35.5 |
| 4,777,358 | 10/1988 | Nelson | 356/35.5 |
| 4,789,236 | 12/1988 | Hodor et al. | 356/33 |

OTHER PUBLICATIONS

"Quasi-Distributed Polarimetric Strain Sensor for Smart Skin Applications", Spillman et al., SPIE vol. 1170, Fiber Optic Smart Structures and Skins II (1989), pp. 483-494.

"High Birefringence Optical Fibre Pressure Sensor", Farhadiroushan et al., SPIE vol. 949, Fibre Optics, '88, pp. 162-169.

"Polarimetric Fiber Optical Sensor with High Sensitivity Using a Fabry-Perot Structure", Maystre et al., Applied Optics, vol. 28, No. 11, Jun. 1, 1989, pp. 1995-2000.

"Fibre-Optic Force Recording of Mechanical Contact Between Teeth", Jamsa et al., Medical & Biological Engineering & Computing, Jan. 1990, pp. 89-91.

"Investigations in a Tactile Sensor Based on Fiber-Optic Interferometric Strain Gauges", Norbert Furstenau, SPIE vol. 1169, Fiber Optic and Laser Sensors VII (1989), pp. 531-539.

"Loss-Compensated Photoelastic Fiber Optic Pressure Sensor", Martens et al., Applied Optics, vol. 28, No. 23, Dec. 1, 1989, pp. 5149-5152.

"Heterodyne Polarization Detection for a Fiber Force Sensor", Mosca et al., SPIE vol. 1169, Fiber Optic and Laser Sensors VII (1989), pp. 126-134.

"Birefringent Fiberoptic Pressure Sensor with High Sensitivity", Xie Haiming, Chin. Phys. (USA) vol. 9, No. 3, Jul.-Sep. 1989, pp. 843-847.

"Fiber Polarimetric Stress Sensors", Chua et al., Applied Optics, vol. 28, No. 15, Aug. 1, 1989, pp. 3158-3165.

(List continued on next page.)

Primary Examiner—Samuel A. Turner
Attorney, Agent, or Firm—Ronald E. Myrick; Barry N. Young; Ronald C. Hudgens

[57] ABSTRACT

A method and apparatus for optically determining the distribution of normal force present at the mating surfaces of an electrical surface connector uses the birefringent properties of a photoelastic material. Photoelastic members are distributed between the two planar surfaces, and plane-polarized, narrow-band wave-length light is coupled into each member with an optical fiber. The light is directed to propagate along a principle strain axis of the photoelastic member. The temporarily birefringent photoelastic material provides a relative propagation delay between vector components of the light in each member which are perpendicular to the propagation direction. The light exiting each member is input to a plane polarizer, the output of which is measured with an intensity meter. The relative delay between the vector components creates a detectable change in intensity at the intensity meter. Correlation of the measurements for all the photoelastic members give a distribution of the forces across the planar surfaces.

13 Claims, 3 Drawing Sheets

OTHER PUBLICATIONS

"Study on the Sensitivity of Photoelastic Optic Fiber Pressure Sensor", Weimin et al., *SPIE* vol. 1169, *Fiber Optic and Laser Sensors VII* (1989), pp. 292-297.

"High-Pressure Polarimetric Sensor Using Birefringent Optical Fibers", W. J. Bock, IEEE Instrumentation and Measurement Technology Conference, 1989, pp. 414-417.

"Fiber Optic Sensor System Using Birefringent Filters for Spectral Encoding", Dorsch et al., SPIE vol. 1011, *Fiber Optic Sensors III,* (1988), pp. 226-234.

"Polarimetric Resonator Sensor with High Sensitivity and Large Dynamic Range", Springer Proceedings in Physics, vol. 44, *Optical Fiber Sensors,* 1989, Maystre et al., pp. 44-46.

"High Hydrostatic Pressure Sensing Using Highly Birefringent Optical Fibres", Bock et al., *International Journal of Optoelectronics,* 1989, vol. 4, Nos. 3/4, pp. 295-301.

"High Sensitivity Transducer for Fiber-Optic Pressure Sensing Applied to Dynamic Mechanical Testing and Vehicle Detection on Roads", Tardy et al., Springer Proceedings in Physics, vol. 44, *Optical Fiber Sensors,* 1989, pp. 215-221.

METHOD AND APPARATUS FOR TESTING ELECTRICAL CONNECTORS

BACKGROUND OF THE INVENTION

Planar connectors, including flexible connectors, mechanical connectors and elastomer interposer connectors, are used in high density electric input/output applications where, because of space limitations, traditional connector technology is incapable of providing the required density. For example, in FIG. 1 a flexible interconnect 10 is part of a multi-chip unit (MCU) and provides connection between a high-density signal carrier (HDSC) 22 of the MCU and bumped gold contacts 32 on the interconnect 10. Interconnect 10 is comprised of flexible copper interconnect wires 12 integrated on an insulative polyimide film 14. The wires terminate at bumped gold contacts 32 which are distributed along a flat connection surface of the interconnect 10. The flexible interconnect 10 extends over a spring member, or more commonly, as shown in FIG. 1, an elastomer 16. The MCU is mated with a planar module 20 such that the gold bump contacts make conductive contact with gold-plated conductive pads on the side of the planar module 20 facing the interconnect 10. The elastomer 16 provides an opposing contact normal force for pressing the gold bumps on interconnect circuit 10 against the gold-plated pads 18 of the planar module 20.

A problem inherent in this technology is that the quality of the electrical contacts is often not uniform across the planar connection surface of the interconnect 10. This is particularly true when an elastomer 16 is used to support the interconnect. Such elastomers creep with age and applied pressure, and also can take on a set. That is, elastomers are not fully elastic and after compression, they do not return to their original shape. The amount of compression set is not constant and batch-to-batch variations can be significant. The resistance at each contact point on the interconnect is inversely proportional to the force normal to the planar connection. Hence, the resulting electrical integrity of the interconnect depends on the physical properties of the elastomer, and variations in this material will manifest equivalent variations in signal connection integrity.

In planar flexible connector technology, a method of gaining access to the mating interface without disturbing the interface for the purpose of measuring contact force does not appear to be commercially available. Consequently, a need exists for a method and apparatus for measuring the distribution of forces on contact surfaces or to measure changes in forces as functions of time, number of matings or torquing force.

SUMMARY OF THE INVENTION

The invention relates to methods and apparatus for testing and measuring the distribution of contact normal force between two planar surfaces, and particularly for determining the distribution of normal force between the electrical connection surfaces of two planar surface connectors. This method is particularly useful since the electrical resistance at a surface connection is proportional to the normal force at that point. Thus, the overall normal force distribution provides an indication of the relative quality of electrical contact at the connection points across the surface of the planar connector.

In one embodiment, the contact normal force is measured by positioning an element of photoelastic material, preferably cube-shaped, between a contact of a flexible interconnect and another planar surface (a test board). Light is then passed through a plane polarizer and into the photoelastic element in a direction transverse to the direction of an applied contact force, and along a principle strain direction of the photoelastic material. The plane polarizer polarizes the light at an angle of 45° relative to the principle strain directions of the photoelastic material which are perpendicular to the direction of propagation. The light exiting the photoelastic material passes through an output polarizer (analyzer). The analyzer output is input to a detector with which intensity changes in the exiting light are detected as the amount of force applied to the photoelastic element is changed. The intensity changes are a result of the interferometric combination of vector components of the light perpendicular to the propagation direction. Since the light propagates along a principle strain direction of the photoelastic material, the resulting intensity measurements are of an apparent biaxial strain distribution.

A laser source is preferably used with an optical fiber delivery system which transports light to the photoelastic element. The optical fiber is mated with the surface of the photoelastic material or otherwise optically coupled to the element. The light exiting the photoelastic element is also coupled into an optical fiber and transported to a power detection meter which provides an output signal indicative of the light intensity. The analyzer may be located between the photoelastic element and the fiber, or between the fiber and the power detector.

In a preferred embodiment, an array of photoelastic elements is arranged on a test board. Each of the cubes is positioned such that, when the test board is mated with a planar connector, each photoelastic element is centered about and makes contact with a contact point on the connection surface. An optical fiber delivery system is used with each element such that the light entering and exiting each element is isolated from the light passing through the other elements. The normal forces being applied to the test board are then changed, and changes in intensity output are detected for the light passing through each photoelastic element. This provides an indication of the normal contact force at each contact point of the interconnect and therefore an overall force distribution.

Also in the preferred embodiment, a pad is located between the photoelastic element and the contact bump. The pad is more rigid than the photoelastic material and provides a more even distribution of force throughout the material. The pad may also be a conductive material, such as copper, to allow an ohmmeter to be connected to the bump and the pad. The resistance may then be measured while the force measurement is being made.

The force measurement method allows the determination and/or measurement of the distribution of the normal force at the contact interface of a planar surface connection, and can be used to monitor changes in the force over time or under various conditions, such as through temperature changes and vibrational changes.

DETAILED DESCRIPTION OF THE INVENTION

Turning now to the drawings and, in particular, FIGS. 2 and 3, thereof, the invention will be described in detail in connection with the planar interconnect system of FIG. 1. It should be noted, however, that the invention is in no way limited to the specific interconnect system of FIG. 1, but is believed to have general applicability wherever it is desired to measure normal force between planar surfaces.

Figure 1:
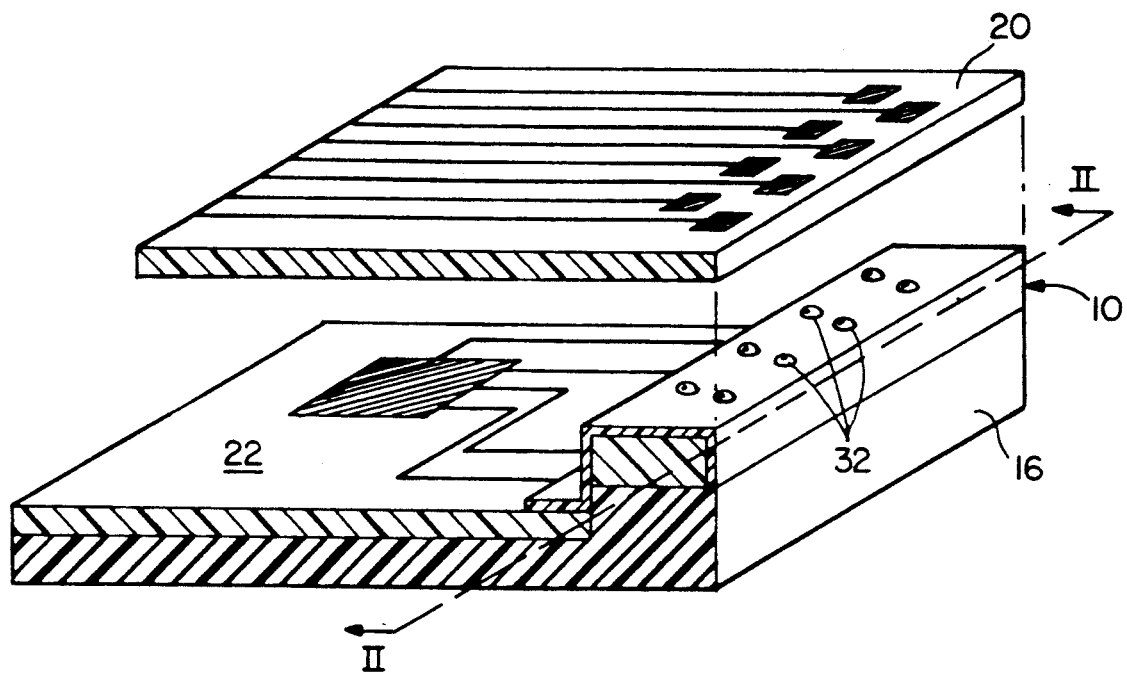
FIG. 1 is a partial perspective of a representative planar interconnect system in which the invention would find applicability.
Figure 2:
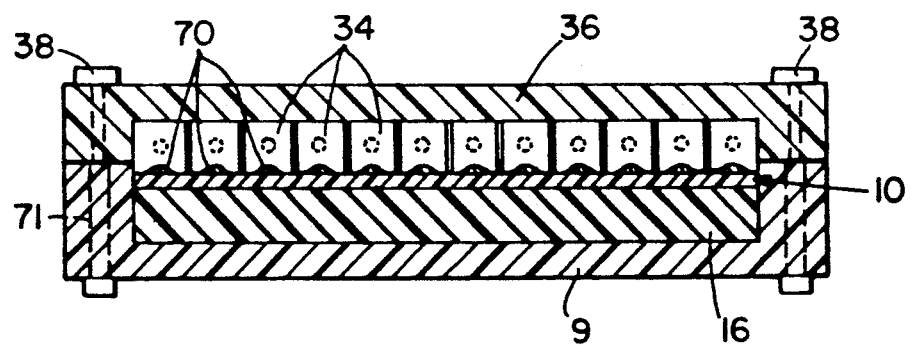
FIG. 2 is a schematic sectional view through a planar interconnect system in which apparatus for measuring contact force has been inserted in place of the planar module.

FIG. 2 is a modified sectional view taken along lines II—II of FIG. 1, with the planar module 20 removed and replaced by a force sensor system of the invention. FIG. 3 is a schematic top view of FIG. 2. Like parts in FIGS. 1-3 retain the same reference numerals.

The force sensor system is comprised of a dummy back panel (test board 36) and a plurality (e.g., twelve) of cubic birefringent photoelastic members 34 disposed beneath board 36 opposite the bumped gold pads 70 in film 14 of interconnect circuit 10. The photoelastic elements have the property of changing their birefringence with changes in strain on the photoelastic material. The force sensor system further includes a light source 60 optically coupled by optical fiber 66 to a translator system 52. Translator 52 selectively couples fiber 66 to one of the twelve input fibers 68 each of which abuts a vertical face of one of the photoelastic members 34. The broken line circles on the face of the cubes 34 in FIG. 2 illustrate where an optical fiber contacts each cube. These fibers are shown in FIG. 3.

Translator 52 may comprise a combination of mechanical and/or electrical stages in which the fibers 68 are mounted on a holder in a linear array as one fiber after another is translated past fiber 66. The position of the translator may be modified manually or automatically depending on the nature of the system supporting the sensor system. Note that fiber 66 may be replaced by a collimating lens and focal lens with a shutter such that light from source 60 is focused on the proximal end of the array of fibers 68. In the preferred embodiment, light source 60 comprises a coherent light source, such as a solid state or gas laser. A wavelength of 633 nm (such as from a helium-neon laser) is preferred for the present embodiment, although wavelength may be varied to modify system sensitivity.

Light from source 60 is selectively coupled to one of the cubic photoelastic members 34 with translator 52, and is incident on a face of the member. The incident light travels or propogates perpendicular to two of the principle axes of strain exerted on cube 34 resulting from the cube 34 being compressed between test board 36 and a contact bumps 40 on interconnect 10. Thus, the light propagates along a third principle strain axis of the element. Since one of the principle strain directions of the material is in the direction of the contact force, the propagation direction is transverse to the direction of the contact force.

As shown in FIG. 2, the force sensor system is clamped at the corners, each of which has a fastener 38. The base portion 9 has posts 71 extending upward at the corners of the assembly. These posts 71 meet with extending portions of the test board 36 and are secured by fasteners 38. As shown, the level of the posts 71 is such that when actual connection is being made between planar module 20 and interconnect 10 (as shown in FIG. 1) the planar module 20 sits flat on the top of the posts 71, and the gold contact pads on the module contact gold bumps 70, compressing the elastomer 16 underneath. However, the unique shape of test board 36 is intended to accommodate the photoelastic cubes 34 within the force testing region.

The downward force exerted on cubes 34 when fasteners 38 are tightened, is opposed by the spring force of elastomer cushion 16 disposed on HDSC 22. The index of refraction of the cubes 34 is affected by this force. The photoelastic material of the cubes is birefringent, and is preferably temporarily birefringent. That is, as the force is increased and the material of a cube is further deformed, the birefringence of the material continues to change. Thus, the light passing through a particular cube is resolved into vector components perpendicular to the propagation direction.

In general, light passing through a cube is directed along an axis transverse to the direction of the contact force. Since the direction of the contact force is known, the three orthogonal principle strain directions of the material are also known. The light input to the cube is directed along one of the principle strain directions. The birefringence of the cube resolves the light into orthogonal vector components which are then aligned with the other two strain directions. Each of these vector components experiences a propagation delay which is dependent on the index of refraction in the direction of that component. The birefringence of the photoelastic material changes in each of the principle strain directions as the strain in that direction changes. Since each vector component is aligned with one of the principle strain directions, the propagation delay of each component depends on the strain in the direction of that component.

The light vector components, $v_x$ and $v_y$, each have a different speed $c/n_x$ and $c/n_y$ wherein c is the speed of light, $n_x$ is the index of refraction seen by vector $v_x$ and $n_y$ is the index of refraction seen by vector $v_y$. As the contact force on the cube is increased, the difference in the strains in the vector components directions increases, and the relative propagation delay of the components increases.

The present invention achieves a discrete optical strain measurement in a three-dimensional photoelastic element (as opposed to a thin photoelastic film, which approximates a two-dimensional photoelastic response). By directing the input light along a principle strain axis of the material, the strain in that direction does not affect the interferometric measurement resulting from the combination of the vector components in the other two strain directions. Thus, although strain exists in each of the three principle strain directions, an apparent biaxial strain distribution is created, since the intensity changes in the system output result only from relative phase delays of the two vector components perpendicular to the propagation direction.

In the preferred embodiment, the input polarizer 35 to each cube 34 is a plane polarizer, the output of which is oriented at 45° relative to each of the principle strain directions being measured. Thus, each of the resolved vector components of the light propagating through the cube 34 has a contribution approximately equal to the other. The output polarizer (analyzer 63) polarizes at an orientation 90° relative to input polarizer 35. Thus, it is also at an angle of 45° relative to the vector component directions.

Figure 3:
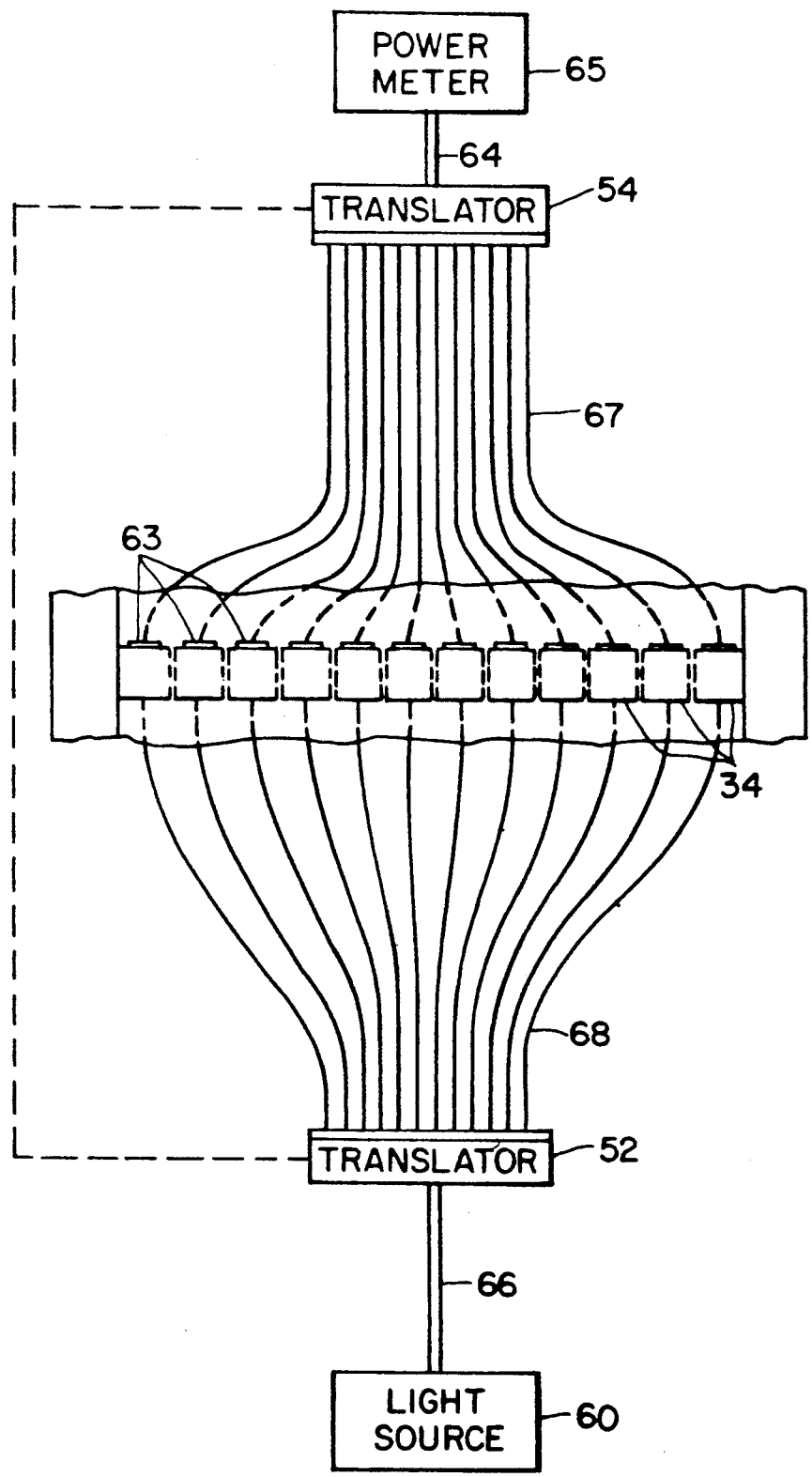
FIG. 3 is a top view of the section of FIG. 2.

As shown in FIG. 3, each cube 34 has an analyzer 63 associated with it for polarizing light exiting the cube. When the two vector light beam components exit the analyzer 63, they are coupled into translator 54 by one of output fibers 67. In the preferred embodiment, a graded-index (GRIN) lens is also used at the output of each cube 34, to reduce the diameter of the light exiting the cube. In that embodiment, the GRIN lens is coupled together with the analyzer 63 in FIG. 3. Since light passing through such a photoelastic medium typically undergoes considerable dispersion, coupling directly into a fine fiber could result in substantial attenuation of the optical signal. However, use of the GRIN lens "funnels" the light into the receiving fiber, reducing such losses. It is noted, however, that use of the GRIN lenses is particular to the present embodiment and is not required for proper operation of the invention. Furthermore, those skilled in the art will also recognize that one analyzer 63 could be used between translator 54 and power meter 65 as an alternative to the plurality of analyzer elements 63 shown in FIG. 3.

In FIG. 3, the light is coupled from translator 54 to fiber or lens 64 and then to intensity power meter 65. The analyzer 63 outputs a light signal which is an interferometric combination of the above-mentioned vector components. Overall intensity of the polarized signal is therefore dependent on the relative propagation delay between the two components. The power meter 65 detects the intensity I of the recombined light. This intensity I is related to the delay δ between the components by the following equation:

$$I = \frac{\sin^2 \pi \delta}{\lambda} \quad \text{Equation 1}$$

where: λ=wavelength of incident light and the delay δ is distance in meters. The delay is in turn related to the difference in the principle strains $\epsilon_x$ and $\epsilon_y$ formed in the cube in the two directions perpendicular to the direction of light propagation. These strains are generated by the normal force on the cube, and can be related to the delay by Equation 2 below:

$$\delta = (n_x - n_y)t = k(\epsilon_x - \epsilon_y)t \quad \text{Equation 2}$$

wherein t=thickness of the cube and k=the strain optic coefficient, which is a constant parameter of the photoelastic material chosen. Thus, the power meter 65 can be calibrated so that the intensity measured by the meter 65 is directly related to the normal contact force, which is the desired parameter.

As demonstrated by the above equations, the sensitivity of the force sensing system is dependent on a number of factors including wavelength of the light, size of the photoelastic element 34 and the photoelastic material used for the element 34. Thus, by properly selecting these parameters, one skilled in the art can routinely obtain a response in the desired range for a corresponding range of expected forces.

Figure 4:
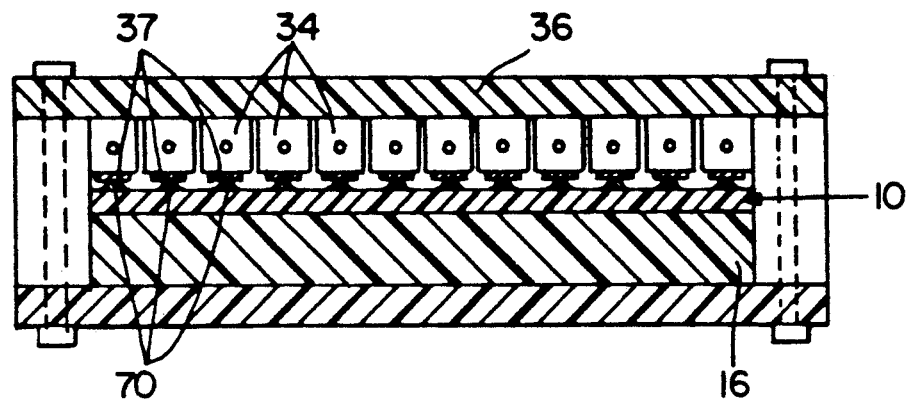
FIG. 4 is a sectional view of an alternate embodiment of the invention.

In the embodiment of FIG. 4, a pad 37 is provided between each cube 34 and its corresponding bump 70. Note that like parts in FIGS. 2 and 4 have the same reference numeral designations and need not be further described in detail herein. The material of pad 37 is more rigid than the photoelastic material of the cubes. Thus, the compressing force at the peak of each bump 70 is distributed across the large surface area of the pad 37. The pad 37 may cover the entire surface area of the cube 34. The use of the pads provides more even distribution of the contact force across the photoelastic material of the cubes 34. Thus, the contact force is better translated to the principle strain axes and prevents a cube from deforming nonlinearly around the shape of its corresponding bump 70.

In an alternate embodiment, resistance at each bump contact 70 is measured concurrently with each normal force measurement. In this embodiment, the pads 37 of FIG. 4 are conductive and are each individually wired to an ohmmeter, the other side of which is connected to the gold bump 70 adjacent which the particular pad 37 resides. Changes in resistance are then measured as the applied force changes. Thus, as the applied normal force changes, the strain for each cube can be measured, as well as the contact resistance for the gold bump 70 adjacent that cube.

In summary, the present invention provides a means for testing and measuring the amount and distribution of force applied to a connector interface. In general, the means involves providing a material which registers an optically measurable change when a force is applied to a surface of the interface. The application of the force results in a change in the photoelastic material which can be observed and measured.

In the embodiments of FIGS. 2-4, the amount of contact normal force is measured by providing a photoelastic member in the strain region which has planepolarized narrow bandwidth light passed through it along a principle strain axis. The force changes the birefringent properties of the photoelastic material and induces a relative delay in the vector components of the light perpendicular to the propagation direction. The light exiting the photoelastic material is passed through an analyzer which polarizes at 90° relative to the input polarizer. The interference of the vector components produces an output from the analyzer which is changed in intensity based on the amount of relative phase delay between the recombined components. This relative phase delay increases with increasing contact force, and the degree of change in intensity is therefore indicative of the amount of contact normal force which occurs at the discrete location of the photoelastic member. With a plurality of such discrete members, a distribution of force across a planar surface is obtained.

The cube shape of the photoelastic members of the present invention provides certain advantages, particularly in providing flat surfaces which contact the flat surfaces between which the photoelastic material is compressed. This allows good distribution of the strains relative to the principle strain axes. It also provides flat surfaces for coupling light into and out of the material. In addition, the width of the cube is easily controlled in all three dimensions. It is noted that the element does not have to be a perfect cube, and in fact could be any shape which allows determination of the principle strain directions in the material.

The present invention can be used to determine the following:

1) Pad to Pad Variations

Distribution of contact force over a number of contact pads (or bumps) can be observed by using the above method to measure the intensity changes for light passed through each of a number of photoelastic elements, each associated with a different contact pad.

2) Force Distribution Over Time

After mating a board with an interconnect, time is needed for an elastomer supporting the interconnect to flow under pressure. If the test board of the present invention is used, and the measurements at each of the photoelastic members are made periodically, this flowing (creeping) may be observed by recording the measurements over time. Long term creep can therefore be observed.

3) Force Distribution Under Dynamic Thermal Conditions

The connector system is composed of materials with varying coefficients of thermal expansion. The system is working in close proximity to thermal generators and cooling systems. The connector system may be affected by thermal gradients. By changing temperature conditions while the test board is in place and measurements are made at each contact point, observation of normal force under dynamic temperature conditions is made possible. (The thermal effects on the test elements of the invention are calibrated out and/or compensated for with feedback from a thermocouple.)

4) Torquing Force and Sequency

The MCU is usually mated with the planar module by bolts which pass through the MCU and the planar module, and are secured to a sturdy backframe. Contact between the bumps of the interconnect and contact pads of the planar module is then achieved by tightening the bolts enough compress the elastomer and mate the contacts. Presently, it is not understood how torque values on the bolts at the assembly level translate to forces at different contact points. Implications of torque sequence or pattern are critical. By making measurements at each contact point while the force of the mechanical attachment is increased, the changes in contact force at different points on the connector with tightening of the connector can be determined.

5) Contact Force Response to Vibration

If measurements are made while mechanical vibration of the connector is changed, the response of electrical connections to vibration can be determined. This provides better determination of how the connections of the unit will perform in harsh environments.

EQUIVALENTS

Those skilled in the art will recognize, or be able to ascertain using no more than routine experimentation, many equivalents to the specific embodiments of the invention disclosed herein. Such equivalents are intended to be encompassed by the following claims. As one example, the intensity power meter could be replaced with a plurality of photodetectors each associates with one of the photoelastic cubes. Other equivalent substitutions are also intended to be encompassed by the present invention.

Figure 5:
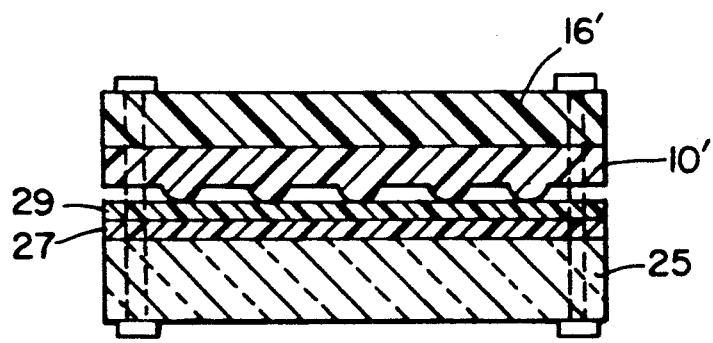
FIG. 5 is a sectional view of yet another embodiment of the invention.

An example of an alternate embodiment is shown in FIG. 5. A flexible circuit 10', backed by an elastomer 16', is mated in its normal housing configuration with a substrate 25 which is transparent to light, for example plexiglass or fused quartz glass, and this substrate material is coated or laminated with a film comprised of a photoelastic material 29. Covering the photoelastic material is a polarizer material 27, such as Polaroid ®, a trademark of the Polaroid Corp. Under contact pressure, the photoelastic material 29 changes the amount of delay in the resolved components of the light. This results in interference fringe patterns being visible when the material is viewed through the polarizer 27 from a direction approximately normal to the surface of the photoelastic material. The particular shape and size of the fringe patterns indicates the high and low pressure points in the photoelastic material 29. However, this embodiment provides only a qualitative measure of force distribution, and not a quantitative measurement like the preceding embodiments.

We claim:

1. A method of determining the relative quality of electrical contact across closed opposing planar surfaces of a separable two member electronic interconnect where one of the two opposing planar surfaces is resilient and has closely spaced apart electrically conductive contact bumps thereon, the method comprising:

locating a member of photoelastic material having planar exterior surfaces in pressure transfer relationship with each of the electrically conductive contact bumps on the resilient planar surface, each of such members being located to have one of its planar surfaces facing toward such resilient surface;

pressing each of the individual members of photoelastic material and its corresponding electrically conductive bump together to induce increased stress in the photoelastic material of the individual members;

coupling plane-polarized narrow-bandwidth light into the individual members of photoelastic material at 45 degrees with the direction of force orthogonal to the direction of light propagation; and detecting in the plane-polarized light exiting the individual members of photoelastic material the relative phase delay created by the birefringence produced in such individual members as a result of the increased force of pressing.

2. A method according to claim 1 wherein coupling light into the photoelastic member comprises transporting light from a narrow band light source with an optical fiber.

3. A method according to claim 1 further comprising coupling light received exiting the photoelastic member into an optical fiber.

4. A method according to claim 3 wherein coupling the light exiting the photoelastic member into an optical fiber comprises coupling the light into an optical fiber with a graded-index lens.

5. A method according to claim 1 further comprising providing a pad of material more rigid than the photoelastic material between each of the members of photoelastic material and its corresponding electrically conductive bump.

6. A method according to claim 5 wherein said pad is made of a conductive material.

7. A method according to claim 1 wherein providing a member of photoelastic material comprises providing a member of temporarily birefringent photoelastic material.

8. The method of claim 1 wherein the step of locating a member of photoelastic material having planar exterior surfaces in pressure transfer relationship with each of the electrically conductive contact bumps on the resilient planar surface comprises locating a cube in pressure transfer relationship with each of such bumps.

9. The method of claim 8 wherein pressing is accomplished by urging each of the individual members of photoelastic material toward its corresponding electrically conductive bump.

10. The method of claim 9 wherein each of the individual members of photoelastic material is urged toward its corresponding electrically conductive bump with a test board.

11. Apparatus for determining the relative quality of electrical contact across closed opposing planar surfaces of a separable two member interconnect where one of the two opposing planar surfaces is resilient and has closely spaced apart electrically conductive contact bumps thereon, the apparatus comprising:

means or providing a member of photoelastic material in pressure transfer relationship with each of the electrically conductive contact bumps on the resilient planar surface;

means for coupling plane-polarized narrow-bandwidth light into the individual member of photoelastic material at 45 degrees with the direction of force orthogonal to the direction of light propagation; and means for detecting in the plane-polarized light exiting the individual members of photoelastic material the relative phase delay created by the birefringence produced in such individual members as a result of the increased pressing force.

12. An apparatus according to claim 11 further comprising an optical fibre transporting light to individuals members of photoelastic material.

13. An apparatus according to claim 11 further comprising pad of material more rigid than the photoelastic material positioned between individual photoelastic members and the electrically conductive bumps on the resilient surface.

* * * * *